(12) United States Patent
Fu et al.

(10) Patent No.: US 11,335,868 B2
(45) Date of Patent: May 17, 2022

(54) FLEXIBLE SUBSTRATE, METHOD OF PREPARING THE SAME, AND DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Jianbo Fu, Beijing (CN); Dan Tang, Beijing (CN); Hailong Wu, Beijing (CN); Yi Dan, Beijing (CN); Dalong Mao, Beijing (CN); Haipeng Zhu, Beijing (CN); Yan Zhou, Beijing (CN); Yanlin Han, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 16/643,075

(22) PCT Filed: Jan. 11, 2019

(86) PCT No.: PCT/CN2019/071348
§ 371 (c)(1),
(2) Date: Feb. 28, 2020

(87) PCT Pub. No.: WO2020/143025
PCT Pub. Date: Jul. 16, 2020

(65) Prior Publication Data
US 2021/0242412 A1    Aug. 5, 2021

(51) Int. Cl.
*H01L 27/32* (2006.01)
*H01L 51/00* (2006.01)
*H01L 51/56* (2006.01)

(52) U.S. Cl.
CPC ........ *H01L 51/0097* (2013.01); *H01L 27/326* (2013.01); *H01L 27/3232* (2013.01); *H01L 27/3276* (2013.01); *H01L 51/56* (2013.01)

(58) Field of Classification Search
CPC ............ H01L 51/0097; H01L 27/3232; H01L 27/326; H01L 27/3276; H01L 51/56;
(Continued)

(56) References Cited

U.S. PATENT DOCUMENTS

2007/0090350 A1* 4/2007 Lee ..................... H01L 51/5275
257/40
2015/0380466 A1* 12/2015 Koo .................... H01L 51/5275
257/40
(Continued)

FOREIGN PATENT DOCUMENTS

CN    108597377 A  *  9/2018
JP    2002278515 A     9/2002
(Continued)

OTHER PUBLICATIONS

First Chinese Office Action from Chinese Patent Application No. 201980000056.8 dated Mar. 28, 2022.

*Primary Examiner* — Bitew A Dinke
(74) *Attorney, Agent, or Firm* — Dilworth & Barrese, LLP.; Michael J. Musella, Esq.

(57) ABSTRACT

A flexible substrate, as well as a method of preparing the same, and a display panel are disclosed. The flexible substrate includes: a base substrate; a first light-emitting element and an optical filter disposed on the base substrate. The optical filter is configured to receive the first light beam emitted by the first light-emitting element and filter the first
(Continued)

light beam to obtain a second light beam, and configured to enable physical properties of the second light beam to be modulated by a bending degree of the flexible substrate at a position where the optical filter is located.

18 Claims, 6 Drawing Sheets

(58) Field of Classification Search
CPC .... H01L 27/3225; Y02P 70/50; Y02E 10/549; G09F 9/301
See application file for complete search history.

(56) References Cited

U.S. PATENT DOCUMENTS

| | | | |
|---|---|---|---|
| 2016/0013415 A1* | 1/2016 | Ren | H01L 27/1225 257/40 |
| 2017/0062770 A1* | 3/2017 | Jang | H01L 51/5293 |
| 2017/0125489 A1* | 5/2017 | Jang | H01L 27/322 |
| 2017/0155094 A1* | 6/2017 | Joung | H01L 51/5225 |
| 2019/0006626 A1* | 1/2019 | Kim | H01L 51/5262 |
| 2019/0067381 A1* | 2/2019 | Kim | H01L 27/322 |
| 2019/0067383 A1* | 2/2019 | Jo | H01L 27/322 |
| 2019/0165321 A1* | 5/2019 | Choi | H01L 27/322 |
| 2019/0165323 A1* | 5/2019 | Jo | H01L 51/5225 |
| 2019/0189966 A1* | 6/2019 | Jang | H01L 51/5275 |

FOREIGN PATENT DOCUMENTS

| | | | | |
|---|---|---|---|---|
| JP | 2011095577 A | | 5/2011 | |
| KR | 20160015815 A | * | 2/2016 | |
| KR | 20170097816 A | * | 8/2017 | ......... H01L 21/0273 |
| WO | 2010090519 A2 | | 8/2010 | |

* cited by examiner

FLEXIBLE SUBSTRATE, METHOD OF PREPARING THE SAME, AND DISPLAY PANEL

Embodiments of the present disclosure relate to a flexible substrate, a method of preparing the same, and a display panel.

BACKGROUND

With the development of flexible electronic technology, the flexible electronic devices having flexible properties are gradually favored by people. For example, organic light-emitting diode (OLED) display panels are widely used in flexible display products, e.g., foldable mobile phones, wearable devices, or "roll-type" televisions, etc., due to their good flexibility, and have greatly enriched and facilitated people's lives.

SUMMARY

At least an embodiment of the present disclosure provides a flexible substrate comprising: a base substrate; a first light-emitting element and an optical filter disposed on the base substrate. The optical filter is configured to receive a first light beam emitted by the first light-emitting element and filter the first light beam to obtain a second light beam, and configured to ensure physical properties of the second light beam to be modulated by a bending degree of the flexible substrate at a position where the optical filter is located.

In some embodiments, the optical filter comprises a first film layer configured to receive the first light; the first film layer comprises a plurality of grating ridges that are periodically arranged to form a gating configured to filter the first light beam incident on the first film layer to obtain the second light beam.

In some embodiments, the optical filter further comprises a second film layer and a third film layer; the third film layer, the first film layer, and the second film layer are sequentially disposed on the base substrate, and the refractive index of the first film layer is higher than the refractive indexes of the second film layer and the third film layer to form a first optical waveguide; and the extension direction of the first optical waveguide is aligned with the periodical arrangement direction of the grating ridges.

In some embodiments, the first light-emitting element comprises a first electrode, a light-emitting layer, and a second electrode; the first electrode and the second film layer are disposed in the same layer or formed in an integrated structure.

In some embodiments, the flexible substrate further comprises a first insulation layer disposed on the base substrate; the first light-emitting element is disposed on the first insulation layer, and a part of the first insulation layer operates as the first film layer or the third film layer in the optical filter.

In some embodiments, the flexible substrate further comprises a light shield layer disposed on the optical filter surface.

In some embodiments, the first film layer comprises a first surface on the incident side of the first light, and the first surface is configured to direct the first light beam into the first optical waveguide.

In some embodiments, the extension direction of the first optical waveguide is parallel to the base substrate, and the angle between the first surface and the base substrate is an acute angle.

In some embodiments, the first electrode is disposed on the first surface of the first film layer.

In some embodiments, the flexible substrate further comprises a gate line extending along a first direction and a data line extending along a second direction, the optical filter extends along the first direction and overlaps the gate line in a direction perpendicular to the base substrate; alternatively, the optical filter extends along the second direction and overlaps the data line in a direction perpendicular to the base substrate.

In some embodiments, the flexible substrate further comprises an optical receiver configured to receive the second light beam from the optical filter and transmit the second light beam along a first path.

In some embodiments, the optical receiver comprises a second optical waveguide in connection with the first optical waveguide to receive the second light beam, and the second optical waveguide extends along the first path.

In some embodiments, the optical receiver and the first light-emitting element are disposed on the same side or the opposite sides of the optical filter.

In some embodiments, the flexible substrate further comprises a photoelectric converter disposed at a distal end of the optical receiver away from the optical filter. The photoelectric converter is in connection with the optical receiver to receive the second light beam, and converts the second light beam to an electric signal.

In some embodiments, the flexible substrate further comprises a pixel unit disposed on the base substrate to perform a display operation. The pixel unit comprises a second light-emitting element to perform a display operation.

In some embodiments, the optical filter, the first light-emitting element, and the pixel unit are disposed at the same side of the base substrate.

In some embodiments, the first light-emitting element further operates to perform a display operation.

In some embodiments, the optical filter and the first light-emitting element are disposed on the different side of the base substrate from the pixel unit.

At least an embodiment of the present disclosure further provides a display panel comprising the above flexible substrate.

At least an embodiment of the present disclosure further provides a method of preparing a flexible substrate, and the method comprising: providing a base substrate, and forming a first light-emitting element and an optical filter on the base substrate. The optical filter is configured to receive a first light beam emitted by the first light-emitting element and filter the first light beam to obtain a second light beam, and configured to enable the physical properties of the second light beam to be modulated by a bending degree of the optical filter at a position where the flexible substrate is located.

In some embodiments, the forming the optical filter comprises: forming a third film layer on the base substrate; forming a first film layer comprising a plurality of grating ridges that are periodically arranged on the third film layer to form a gating; forming a second film layer on the first film layer; the refractive index of the first film layer is higher than the refractive indexes of the second film layer and the third film layer to form a first optical waveguide; and the extension direction of the first optical waveguide is aligned with the periodical arrangement direction of the grating ridges.

At least an embodiment of the present disclosure further provides a method of measuring a bending degree of a flexible substrate comprising a base substrate and a first light-emitting element and an optical filter disposed on the base substrate; the optical filter is configured to receive a first light beam emitted by the first light-emitting element and filter the first light beam to obtain a second light beam, and configured to enable the physical properties of the second light beam to be modulated by a bending degree of the optical filter at a position where the flexible substrate is located. The measurement method comprises: the first light-emitting element emits a first light, the optical filter receives and filters the first light beam to obtain a second light beam; and the bending degree of the flexible substrate at a position where the optical filter is located is measured in accordance with the physical properties of the second light beam.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, the technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain some other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "the first," "second," etc., which are used in the description and the claims of the present application for disclosure, are not intended to indicate any sequence, the amount or importance, but distinguish various components. Also, the terms such as, "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", the "connected", etc., are not intended to define a physical connection or mechanical connection, but may include an electrical connection, the directly or indirectly. "On," "under," "right," "left" and the like are only used to indicate relative position relationship, and when the position of the object which is described is changed, the relative position relationship may be changed accordingly.

Although a flexible display can be bent, the stress generated by the bending will cause damage to the devices inside the display if the bending exceeds a certain limit, thereby causing poor display.

For example, a measurement structure can be integrated into a flexible display to measure the bending degree of the flexible display. For example, a strain gage is added to the display; a circuit detection structure (e.g., in combination with a protruding probe) is disposed on the back of the display, and there occurs a short or an electrical connection in the circuit if the display is bent. However, such methods cannot accurately measure the bending degree of the display, and need to have additional components, so that the display has poor safety, integration, and aesthetics.

At least an embodiment of the present disclosure provides a flexible substrate comprises a base substrate and a first light-emitting element and an optical filter that are disposed on the base substrate. The optical filter is configured to receive a first light beam emitted by the first light-emitting element and filter the first light beam to obtain a second light beam, and configured to ensure the physical properties of the second light beam to be modulated by the bending degree of the flexible substrate at a position where the optical filter is located. The embodiment of the present disclosure measures the bending degree of the flexible substrate in combination with optical means, and can effectively prevent the flexible substrate from damage caused by excessive bending. In some embodiments, a real-time measurement can be achieved.

Figure 1A:
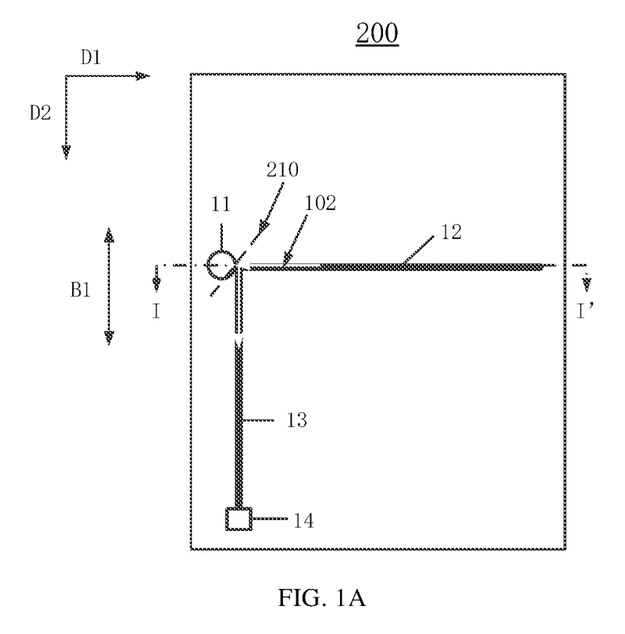
FIG. 1A is a schematic planar view of a flexible substrate provided in some embodiments of the present disclosure.
Figure 1B:
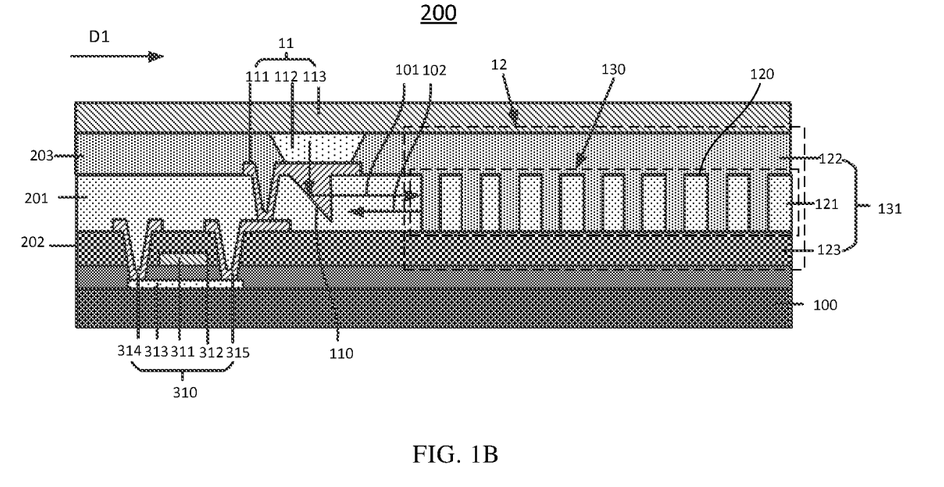
FIG. 1B is a schematic cross-sectional view of FIG. 1A along a section line I-I'.

FIG. 1A is a schematic planar view of a flexible substrate provided in some embodiments of the present disclosure, and FIG. 1B is a schematic cross-sectional view of FIG. 1A along a section line I-I'. As shown in FIGS. 1A and 1B, a flexible substrate 200 comprises a base substrate 100, and comprises a first light-emitting element 11 and an optical filter 12 that are disposed on the base substrate 100. The optical filter 12 is configured to receive a first light beam 101 emitted by the first light-emitting element 11 and filter the first light beam 101 to obtain a second light beam 102, and configured to ensure the physical properties of the second light beam 102 to be modulated by the bending degree of the flexible substrate at a position where the optical filter 12 is located. By detection of the relevant physical properties of reflected light or transmission light, the bending degree of the flexible substrate can be correspondingly obtained.

In some embodiments, the optical filter 12 comprises a grating structure. By use of the filter property of the grating structure, the received first light beam 101 is filtered to obtain a second light beam 102. For example, the second light beam 102 is a reflected light or a transmitted light obtained by filtering the first light beam 101 with the optical filter, and the physical properties of the reflected light or the transmitted light (e.g., the phase, the wavelength, the light intension, or frequency, etc.) are modulated by the bending degree of the flexible substrate at a position where the optical filter 12 is located.

For example, as shown in FIG. 1B, the optical filter 12 comprises a first film layer 121 configured to receive the first light beam 101 emitted by the light-emitting element 11; the first film layer 121 comprises a plurality of grating ridges 120 periodically arranged along a first direction D1 to form a grating 130, and the grating is configured to filter the first light beam 101 that is incident on the first film layer 121 along the first direction D1, so as to obtain the second light beam 102.

For example, as shown in FIG. 1A, the flexible substrate 200 comprises a first bending axis B1, namely, the flexible substrate 200 can be bent along the first bending axis B1. For example, the first bending axis B1 is parallel to a second direction D2.

For example, the grating periodic direction of the grating 130 (i.e., the first direction D1) is orthogonal to the extension direction of the first bending axis B1 of the flexible substrate 200 (i.e., the second direction D2). When the flexible substrate 22 is bent along the first bending axis B1 at the position where the optical filter 12 is located, the bending causes the change of the gaps between the grating ridges 120, namely, the grating period of the grating changes, thereby causing the change of the physical properties of the second light beam 102. By detecting the change in the relevant physical properties of the second light beam 102, the change of the grating period, that is, the strain in the flexible substrate 200, can be obtained, thereby obtaining the bending degree of the flexible substrate 200.

For example, as shown in FIG. 1B, the optical filter 12 further comprises a second film layer 122 and the third film layer 123, and the second film layer 122 and the third film layer 123 are disposed at the upper and lower sides of the first film layer 121, respectively. Namely, the third film layer 123, the first film layer 121, and the second film layer 122 are sequentially disposed on the base substrate 100. The refractive index of the first film layer 121 is higher than the refractive indexes of the second film layer 122 and the third film layer 123 to form a first optical waveguide 131, and the extension direction of the first optical waveguide 131 is aligned with the periodic arranged direction of the grating ridges 120, that is, the first direction D1. For example, the first film layer 121 is a core layer of the first optical waveguide, and the first film layer 121 is sandwiched between the second film layer 122 and the third film layer 123, which constitute an upper cladding layer and a lower cladding layer of the first optical waveguide, respectively. For example, the first optical waveguide 131 and the grating 130 are coupled to form a waveguide grating structure, and e.g., the waveguide grating structure is a planar waveguide grating structure. The first optical waveguide structure facilitates to reduce the attenuation of light during the light being transmitted in the first film layer.

For example, as shown in FIG. 1B, the second film layer 122 can be further filled into the gaps between the grating ridges 120, namely, the grating ridges 120 are surrounded by low refractive index materials (the second film layer 122 and the third film layer 123). However, the embodiments of the present disclosure are not limited to this situation. For example, the gaps between the grating ridges can be filled with a material other than that of the second film layer, as long as the waveguide grating structure can be formed.

For example, the first film layer 121 comprises a transparent material.

For example, both the first film layer 121 and the second film layer 122 are made from organic materials, and the third film layer 123 is made from an inorganic material.

For example, the optical filter 12 has a reflective filter structure. For example, the grating 130 is a reflective gating. For example, the grafting period is less than 1 μm, e.g., in an order of 0.1-0.5 μm; e.g., the grafting period is 0.1 μm; the width of the grating ridges 120 is 0.05 μm, and the gap between the adjacent grating ridges 120 is 0.05 μm.

Figure 2A:
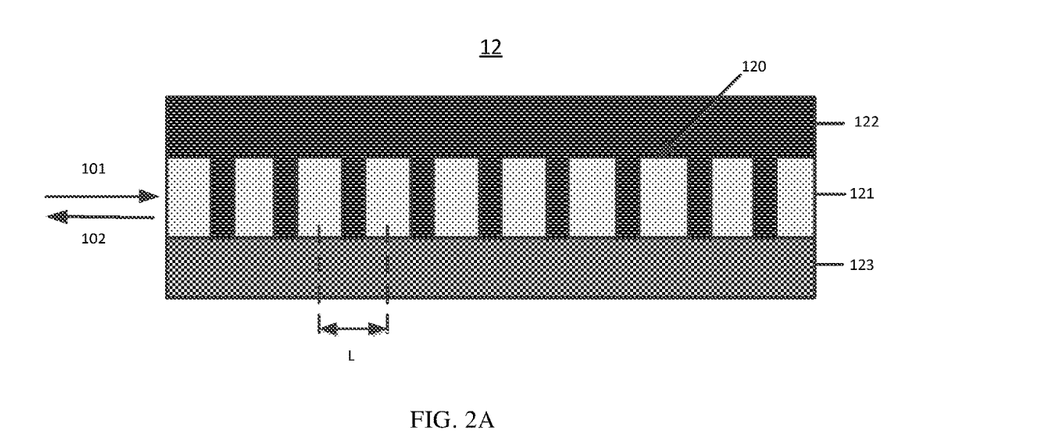
FIG. 2A is a schematic diagram of an optical filter provided in some embodiments of the present disclosure.

FIG. 2A shows a schematic view of an optical filter provided in some embodiments of the present disclosure. According to the coupled-mode theory for a reflective gating, the grating selectively reflects the first light beam 101 incident on the first film layer 121, so as to obtain the second light beam 102 that has a central wavelength matching the refractive index modulation phase of the first film layer 121; the central wavelength λ of the second light beam satisfies the following equation (Bragg grating formula): $\lambda = 2n \cdot L$, where n is the effective refractive index of the grating, and L is the grafting period.

When the flexible substrate 200 is bent at a position where the optical filter 12 is located, the gaps between the grating ridges 120 change, namely, the grating period L of the grating 130 changes, and the central wavelength λ also changes accordingly, namely, the central wavelength λ of the obtained second light beam 102 is modulated by the bending degree of the flexible substrate. The change of the central wavelength λ satisfies the following equation: $\Delta\lambda = 2n \cdot L$, where ΔL is the change of the grating period (strain). The grating strain is calculated as $\Delta L = \Delta\lambda/2n$, namely, the grating strain is linearly related to the change of the central wavelength of the second light beam 102. It can be seen that the bending degree of the flexible substrate can be calculated by detecting the central wavelength of the second light beam 102.

Figure 2B:
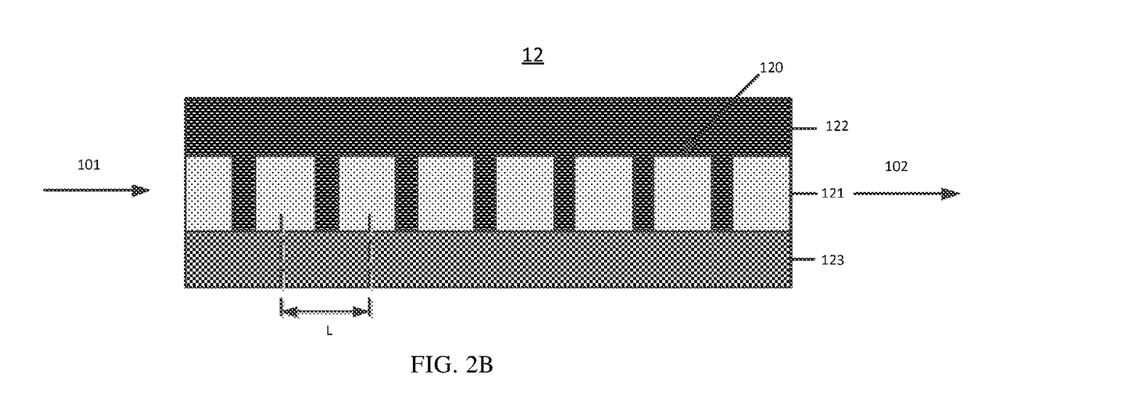
FIG. 2B is a schematic diagram of an optical filter provided in some other embodiments of the present disclosure.

In some other examples, the optical filter 12 is a transmissive filter structure. For example, the grating 130 is a transmissive grating. For example, the grafting period is greater than 10 μm, e.g., in an order of 100 μm. FIG. 2B shows a schematic view of an optical filter provided in another embodiment of the present disclosure. In the example as shown in FIG. 2B, the first film layer 211 constitutes the core mode of the transmissive grating, and the second film layer 212 and the third film layer 213 constitute the cladding modes of the transmissive grating. According to the transmissive gating theory, the grating selectively transmits the first light beam 101 incident on the first film layer 121, so as to obtain the second light beam 102 that has a central wavelength λ satisfying the following equation:

$$\lambda = (n1-n2) \cdot L,$$

where n1 and n2 are the effective refractive index of the core mode and the cladding mode, respectively, and L is the grafting period.

When the flexible substrate 200 is bent at a position where the optical filter 12 is located, the gaps between the grating ridges 120 change, namely, the period L of the grating 130 changes, and the central wavelength λ also changes accordingly, namely, the central wavelength λ of the obtained second light beam 102 is modulated by the bending degree of the flexible substrate. The change of the central wavelength λ satisfies the following equation:

$$\Delta\lambda = (n1-n2) \cdot \Delta L,$$

where ΔL is the change of the grating period (strain). The grating strain is calculated as $\Delta L=\Delta\lambda/(n1-n2)$, namely, the grating strain is linearly related to the change of the central wavelength of the second light beam 121. It can be seen that the bending degree of the flexible substrate can be calculated by detecting the central wavelength of the second light beam 121.

The first light-emitting element 11 can be implemented in various manners. For example, the first light-emitting element 11 can be an organic light-emitting diode (OLED) or a quantum dot light-emitting diode (QLED). As shown in FIG. 1B, the first light-emitting element 11 comprises a first electrode 111, a light-emitting layer 112 and a second electrode 113. For example, in at least an example, the light-emitting element 11 can further comprise at least one of a hole injection layer, a hole transport layer, an electron injection layer, an electron transport layer, etc., in addition to the light-emitting layer 112.

For example, the first light-emitting element 11 is a bottom emitting structure, and the first electrode 111 is transmissive and the second electrode 113 is reflective. For example, the first electrode 111 is a high-work-function, transparent, conductive material, e.g., indium tin oxide (ITO) or the like; the second electrode 113 is, e.g., a metal or metal alloy material, e.g., an Ag/Mg alloy material.

As shown in FIG. 1B, for example, the first film layer 121 comprises a recessed structure at the incident side of the first light beam to reflect the first light beam 101, which is emitted by the light-emitting layer 112 and longitudinally transmitted, so that the first light beam 101 is horizontally transmitted and directed into the first film layer 121. For example, the recessed structure comprises a first surface 110, which is configured to change the transmission direction of the first light beam 101 to direct the first light beam 101 into the first optical waveguide 131. For example, as shown in FIG. 1B, the extension direction of the first optical waveguide 131 is parallel to the base substrate 100, the angel between the first surface 110 and the base substrate 100 is an acute angle, e.g., 45°, and the first light beam 101 is passed into the first optical waveguide 131 after it is reflected by the first surface 110.

For example, the first light-emitting element 11 at least partly overlaps the first surface 110 in a direction perpendicular to the base substrate 100. For example, the first electrode 111 is disposed on the first surface 110 of the first film layer, and the first light beam 101 emitted by the light-emitting layer 112 is transmitted downward and reflected at the interface between the first electrode 111 and the first film layer 121 (namely, the first surface 110), and then is directed into the first optical waveguide 131.

For example, the flexible substrate 200 further comprises a pixel driving circuit, which is in electrical communication with the first light-emitting element 11 and is configured to drive the first light-emitting element 11 to emitting light. In some examples, the first light-emitting element 11 is an organic light-emitting diode (OLED), the pixel driving circuit can be any conventional OLED pixel driving circuit. For example, the driving circuit 10 is a 2T1C pixel circuit, namely, it comprises two transistors and a capacitor; one of the two transistors is a switching transistor, and the other is a driving transistor. For example, the driving circuit can be a pixel circuit having another structure, e.g., a 3T1C pixel circuit based on the aforesaid 2T1C pixel circuit, or further comprises a pixel circuit with a compensation function, a reset function or the like. The embodiments of the present disclosure are not limited to the above situations.

For clarity, FIG. 1B only shows the first transistor 310 which is in direct connection with the first light-emitting element 11 in the driving circuit. For example, the first transistor 310 can be a driving transistor and configured to operate in a saturated state and control the magnitude of the electrical current that drives the first light-emitting element 11 to emit light. For example, the first transistor 310 can also be a light emission-controlling transistor for controlling whether the electrical current that drives the first light-emitting element 11 to emit light flows through the first light-emitting element 11 or not. The embodiments of the present disclosure are not limited to the above situations.

The type, the material, and material of the first transistor 310 are not limited in the embodiments of the present disclosure. For example, the first transistor can be a top-gate type, a bottom-gate type, etc.; the active layer of the first transistor can be amorphous silicon, polysilicon (low-temperature polysilicon or high-temperature polysilicon), oxide semiconductor (e.g., indium gallium zinc oxide (IGZO)), etc.; and the first transistor can be N-type or P-type.

As shown in FIG. 1B, the first transistor 310 comprises a gate electrode 311, a gate insulation layer 312, an active layer 313, a source electrode 314 and a drain electrode 315. The first electrode 111 of the first light-emitting element 11 is in electrical communication with the drain electrode 315 of transistor 310.

It should be noted that the first transistor 310 can be symmetrical in its physical structure, and thus the source electrode 314 and the drain electrode 315 are structurally interchangeable.

For example, as shown in FIG. 1B, the flexible substrate 200 further comprises a second insulation layer 202, for insulation, disposed between the gate electrode 322 and the source-drain electrode layer of the first transistor 310. The source electrode 314 and the drain electrode 315 of the first transistor 310 are in electric contact with the active layer 313 via through-holes in the second insulation layer 202, respectively.

For example, the flexible substrate 200 further comprises a first insulation layer 201, and the first light-emitting element 11 is disposed on the first insulation layer 201, and is in electrical communication with the first transistor 301 via a through-hole in the first insulation layer 201.

Figure 3:
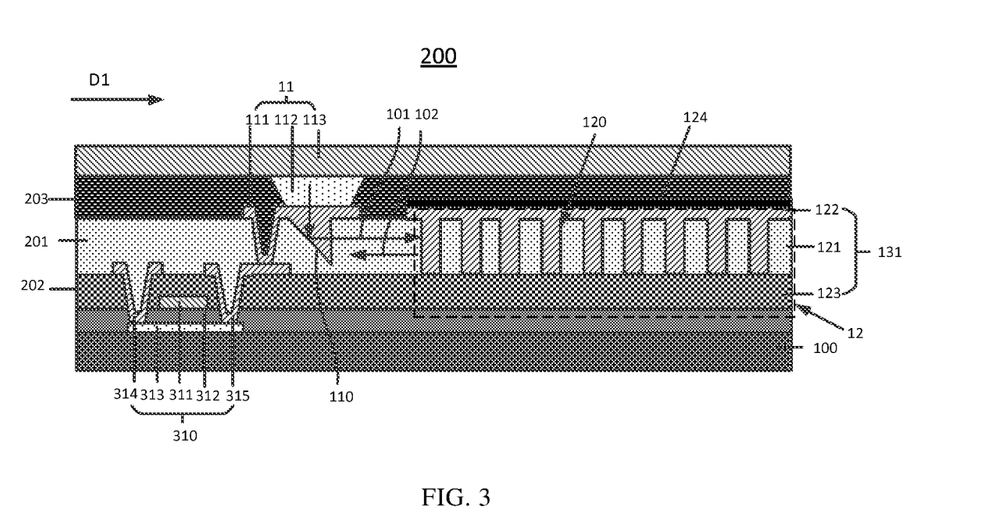
FIG. 3 is a schematic cross-sectional view of a flexible substrate provided in some other embodiments of the present disclosure.
Figure 4:
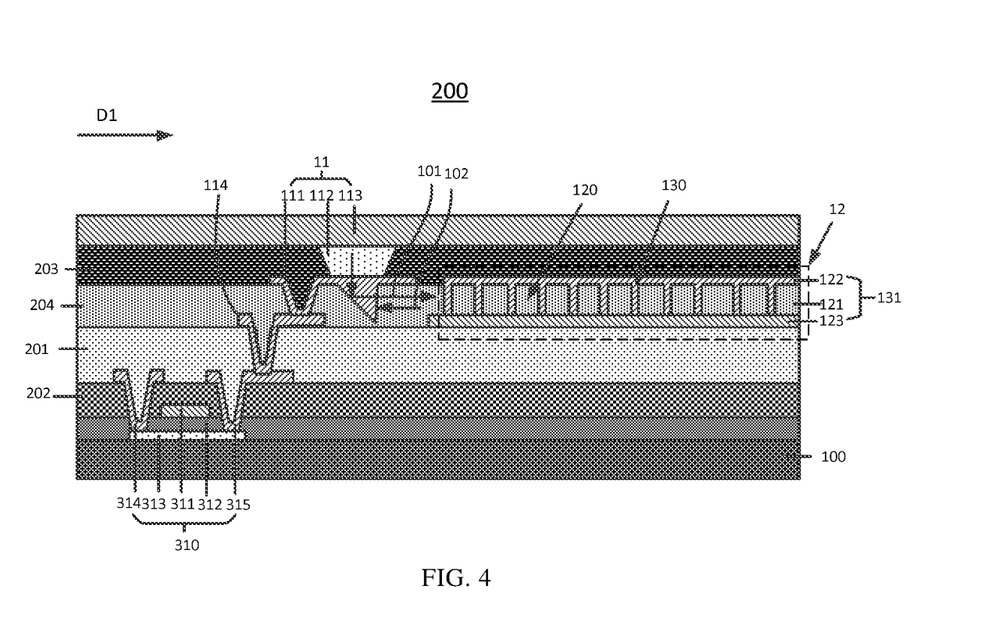
FIG. 4 is a schematic cross-sectional view of a flexible substrate provided in yet some other embodiments of the present disclosure.

For example, the flexible substrate 200 further comprises a first pixel defining layer 203 disposed on the first electrode 111 for defining the light-emitting layers 112 located in different sub-pixels, e.g., for preventing the light-emitting layers 112 located in different sub-pixels from crosstalk during light emission. As shown in FIG. 3 and FIG. 4, an opening is formed in the first pixel defining layer 203 at a position corresponding to the first electrode 111 to at least partly expose the first electrode 111, and the light-emitting layer 112 is at least partly formed in the opening. A second electrode 113 is formed on the light-emitting layer 112 and the first pixel defining layer 203, and in electrical contact with the light-emitting layer 112. For example, the first pixel defining layer 203 comprises a resin or another organic material, e.g., a photosensitive resinous material.

For example, the optical filter 12 can be formed along with the fabrication of the first light-emitting element 11 and/or the driving circuit without using additional materials and processes, so some embodiments of the present disclosure have high process compatibility and will not lead to increased costs.

For example, the first insulation layer 201 is integrally formed with the first film layer 121 or the third film layer 123 of the optical filter 12, namely, a part of the first insulation layer 201 operates as the first film layer 121 or the third film layer 123 of the optical filter 12.

For example, as shown in FIG. 1B, a part of the first insulation layer 201 operates as the first film layer 121 of the optical filter 12. In that case, for example, the through-hole for the first electrode 111 and the gaps between the grating ridges 120 can be formed in the same patterning process.

For example, a part of the second insulation layer 202 operates as the third film layer 123 of the optical filter 12; and a part of the first pixel defining layer 203 operates as the second film layer 122 of the optical filter 12. In that case, the refractive index of the first insulation layer 201 is higher than the refractive index of the second insulation layer 202, and higher than the refractive index of the first pixel defining layer 203.

For example, as shown in FIG. 1A, the flexible substrate 200 further comprises an optical receiver 13; the optical receiver is disposed on the emerging side of the second light beam of the optical filter 12, and configured to receive the second light beam 102 from the optical filter 12 and transmit the second light beam 102 along a first path.

For example, the extension direction of the optical receiver 13 is the extension direction of the first path. For example, the extension direction of the first path can be consistent with the emergent direction of the second light beam, or can be inconsistent with the emergent direction of the second light beam. In the case that the extension direction of the first path can be inconsistent with the emergent direction of the second light beam, a corresponding structure can be provided in the flexible substrate 200 to modify the propagation direction of the second light beam 102 so that the second light beam 102 is transmitted along the first path. The extension direction of the first path is not limited in embodiments of the present disclosure, namely, the extension direction of the optical receiver is not limited, and the position and the extension direction of the optical receiver can be flexibly designed in accordance with the pattern of the flexible substrate.

As shown in FIG. 1A, the optical receiver 13 extends along the second direction D2 to transmit the second light beam 102 along the second direction, namely, the extension direction of the first path is the second direction, and inconsistent with the emergent direction of the second light beam. In this case, for example, a reflecting surface 210 can be formed at the emergent side of the second light beam of the first film layer 121 to direct the second light beam 102 into the optical receiver. FIG. 1A illustrates an optical path diagram of the reflecting surface 210 reflecting the second light beam 102. Detailed description can be referred to the above description of the first surface 110, and are not reiterated here.

For example, as shown in FIG. 1A, the optical receiver 13 can be disposed on the incident side of the first light beam of the optical filter 13, that is, the optical receiver 13 and the first light-emitting element 11 are disposed on the same side of the optical filter 13. In this case, the second light beam 102 is, e.g., reflected light. In the flexible substrate corresponding to the optical filter shown in FIG. 2B, the second light beam 102 is transmitted light. In that case, the optical receiver 13 and the first light-emitting element 11 are disposed on the opposite sides of the optical filter 13.

For example, the optical receiver 13 comprises a second optical waveguide, which is in connection with the first optical waveguide 131 to receive the second light beam 102 emitted from the first optical waveguide 131. The second optical waveguide extends along the first path to transmit the second light beam along the first path. The extension direction of the first path is the extension direction of the second optical waveguide.

For example, the second optical waveguide has a structure similar to that of the first optical waveguide 131. For example, the second optical waveguide is integrally formed with the first optical waveguide, and the corresponding film layers of the two optical waveguides are disposed in the same layer and formed in the same patterning process so that the materials are the same.

For example, as shown in FIG. 1A, the flexible substrate 200 further comprises a photoelectric converter 14, and the photoelectric converter is disposed at a distal end of the optical receiver 13 away from the optical filter 12. The photoelectric converter is in connection with the optical receiver to receive the second light beam and converts the second light beam to an electric signal. The type and structure of the photoelectric converter is not limited in the embodiments of the present disclosure, e.g., it can comprise a photodiode, a photosensitive transistor, or the like.

In some other examples, the optical receiver 13 can be omitted, and the photoelectric converter 14 is in direct communication with the optical filter 12 to receive the second light beam. For example, in the embodiment as shown in FIG. 2B, in the case that the second light beam 102 is transmitted light, the photoelectric converter 14 can be disposed at an end of the optical filter 12 away from the first light-emitting element 11, and in direct communication with the optical filter 12.

For example, the flexible substrate 200 further comprises a processing circuit (not shown), which receives and processes the electric signal converted by the photoelectric converter to obtain the bending degree of the flexible substrate, thereby achieving a precise and real-time measurement. For example, the processing circuit is further configured to control the flexible substrate to emit an alarm signal if the measured bending degree of the flexible substrate exceeds a pre-determined value.

For example, the processing circuit can be implemented by use of a Central Processing Unit (CPU), Field Programmable Gate Array (FPGA), Digital Signal Processor (DSP) or other types of processing units with data-processing capacity and/or command-executing capacity and the corresponding computer commands. The CPU can be a generalized processer or a dedicated processer, and can be an X086- or ARM-based processer based or the like.

☐ For example, the base substrate 100 can be made from a flexible material with good heat resistance and durability, such as, polyimide (PI), polycarbonate (PC), polyethylene vinylterephthalate (PET), polyethylele, poly acrylate, poly arylate, polyetherimide, polyethersulfone, polyvinylterephthalate (PET), polyethylene (PE), polypropylene (PP), polysulfone (PSF), polymethyl methacrylate (PMMA), cellulose triacetate (TAC), cyclic olefin polymer (COP), cyclic olefin copolymer (COC), or the like.

FIG. 3 is a schematic cross-sectional view of a flexible substrate provided in some other embodiments of the present disclosure. In contrast to the flexible substrate shown in FIG. 1B, the flexible substrate 200 in this embodiment uses an electrode material as the second film layer 122 in the optical filter 12. For example, the second film layer 122 and the first electrode 111 of the first light-emitting element 11 are disposed on the same layer or formed in an integrated structure. In this embodiment, the refractive index of the first electrode 11 is lower than that of the first insulation layer.

It should be noted that the phrase "disposed in the same layer" as used in the disclosure means that structures are formed with the same material via the same patterning process so that the structures disposed in the same layer have the same material; and the phrase "integrated structure" means an interconnected structure formed by structures with the same material via the same patterning process.

For example, the first light-emitting element 11 emits visible light, e.g., red light, green light, etc., or non-visible light which can be infrared light, e.g., near infrared light, mid-infrared light, etc. For example, in the case that the first light-emitting element 11 emits visible light, the flexible substrate can further comprise a light shield layer 124 disposed on the surface of the optical filter 12. The light shield layer 124 can prevent the display effect of the flexible substrate 200 from interference by the light transmission of the light in the optical filter 12. For example, the light shield layer material is a black matrix material.

For example, the position of the optical filter 12 can be adaptively adjusted in accordance with the material used in the flexible substrate 200. The embodiments of the present disclosure are limited in this aspect.

FIG. 4 is a schematic cross-sectional view of a flexible substrate provided in another embodiment of the present disclosure. As shown, in the case that the refractive index of the material of the first insulation layer 201 is so low that this material is unable for use as the material for the first film layer 121, a third insulation layer 204 having a relatively high refractive index can be additionally provided as the first film layer 121. In that case, the flexible substrate 200 can further comprise, e.g., a connection electrode 114 disposed between the first insulation layer 201 and third insulation layer 204 for connecting the first electrode 111 to the drain electrode 315 of the first transistor 310. If the depth of the connecting through-hole is too high, the conductive material filled into the through-hole is likely to wrinkle or break (especially under the bending state), and further causes an excessive contact resistance or poor contact. By providing the connecting electrode 114 for connecting the first electrode 111 to the drain electrode 315, the excessive depth of the continuous through-hole for directly connecting the first electrode 111 to the drain electrode 315 of the first transistor 310 can be avoided, thereby facilitating the yield and bending resistant property of the flexible substrate.

For example, an electrode material layer can be additionally disposed as a third film layer 123. For example, the third film layer 123 and the connecting electrode 114 are disposed in the same layer or formed in an integrated structure.

For example, the material of the first insulation layer 201 can be an organic insulating material, such as, a resinous material.

For example, the material of the third insulation layer can be an inorganic insulating material, such as, an oxide or nitride of silicon.

For example, the material of the connecting electrode 114 can be a transparent conductive oxide material, such as, indium tin oxide (ITO).

The flexible substrate provided by some embodiments of the present disclosure can be used for many purposes, e.g., for use in the field of display, which is not limited in the embodiments of the present disclosure.

For example, the flexible substrate can be an organic light-Emitting diode (OLED) array substrate, or can be an LCD array substrate. Hereinafter, the embodiments of the present disclosure are described in details by taking an OLED array substrate as example, but the embodiments of the present disclosure is not limited thereto.

For example, the first light-emitting element 11 and the optical filter 12 can disposed on a display side of the flexible substrate or a non-display side (back) opposite to display side.

For example, when the first light-emitting element 11 and the optical filter 12 are disposed on the display side of the flexible substrate, that is, they are disposed on the same side of the base substrate 100 as the display pixels of the flexible substrate, the first light-emitting element 11 and the optical filter 12 can be manufactured together with the display device of the flexible substrate without additional processes and do not cause cost increase. This is exemplarily illustrated below by reference to FIGS. 5A, 5B, and 5C.

Figure 5A:
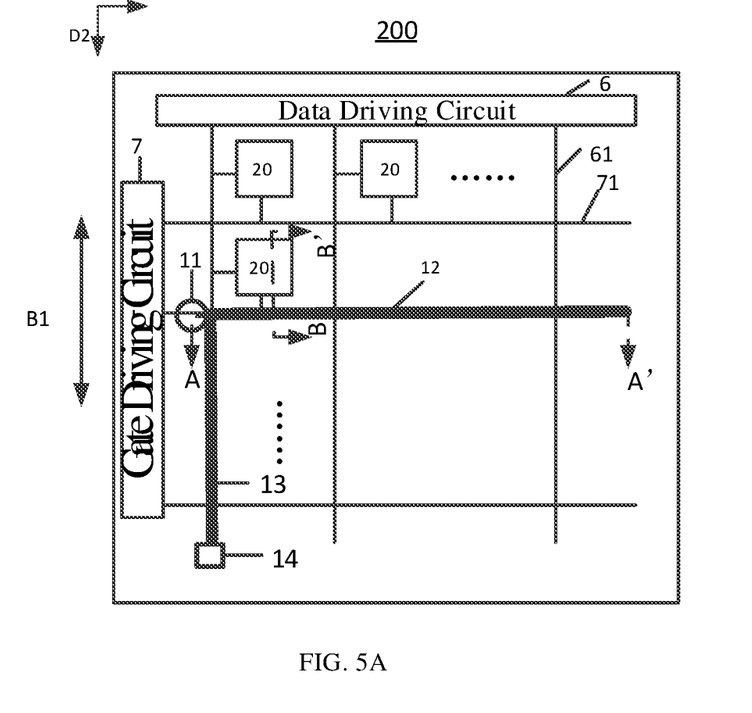
FIG. 5A is a schematic planar view of a flexible substrate provided in some other embodiments of the present disclosure.
Figure 5B:
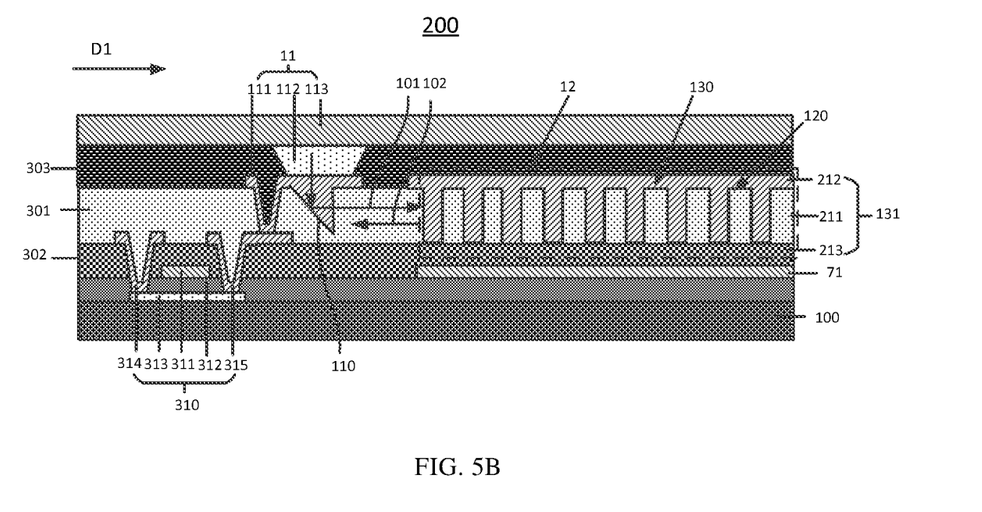
FIG. 5B is a schematic cross-sectional view of FIG. 5A along a section line A-A'.
Figure 5C:
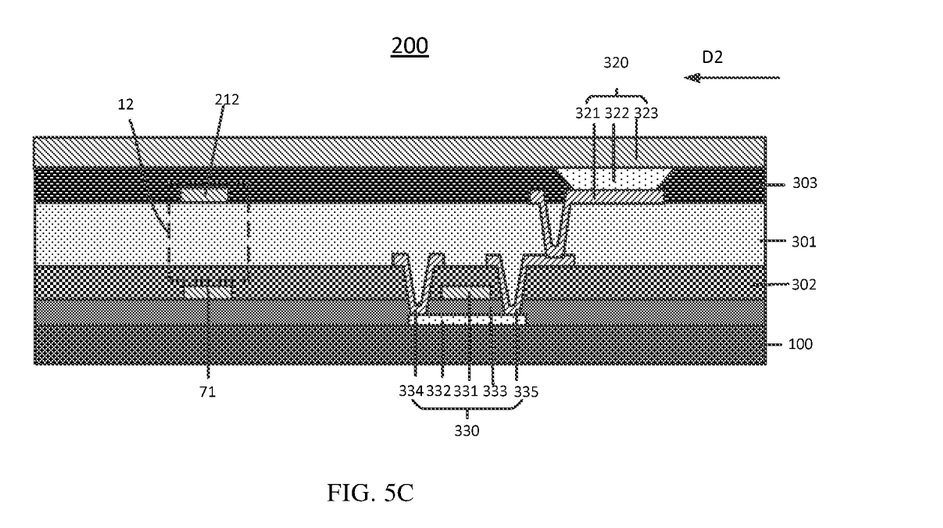
FIG. 5C is a schematic cross-sectional view of FIG. 5A along a section line B-B'.

FIG. 5A is a schematic planar view of a flexible substrate provided in some other embodiments of the present disclosure, FIG. 5B is a schematic cross-sectional view of FIG. 5A along a section line A-A', and FIG. 5C is a schematic cross-sectional view of FIG. 5A along a section line B-B'. For example, as shown in FIG. 5A, the flexible substrate 200 further comprises a plurality of pixel units 20 arranged in an array, as well as a plurality of gate lines 71 and a plurality of data lines 61, the plurality of gate lines 71 and the plurality of the data lines 61 overlap each other to define a plurality of pixel areas, and the plurality of pixel units 20 are distributed in the plurality of pixel areas in one-to-one correspondence.

For example, the flexible substrate can further comprise a data driving circuit 6 and a gate driving circuit 7; the data driving circuit 7 is used to provide data signals to the pixel units 20; and the gate driving circuit 6 is used to provide scanning signals to the pixel units 20. Moreover, the flexible substrate can further comprise other circuits or devices so as to further provide various other control signals. The data driving circuit and gate driving circuit are in connection with the pixel units 20 through the data lines 61 and the gate lines 71, respectively, the pixel units 20 are in connection with the gate lines 61, the data lines 71 or the like to receive the respective electric signals for light emission, thereby achieving a display operation.

For example, each of the pixel units 20 comprises a second light-emitting element and a pixel driving circuit to drive the second light-emitting element to emit light so as to perform a display operation. For example, the pixel driving circuit can comprise a conventional 2T1C pixel driving circuit, namely, it comprises two transistors and a capacitor, one of the two transistors is a switching transistor, and the other is a driving transistor. For example, the pixel driving circuit can also be a pixel driving circuit with other structures, e.g., a 3T1C pixel circuit based on the aforesaid 2T1C pixel circuit, or further comprises a pixel circuit with a compensation function, a reset function or the like, which is not limited in embodiments of the present disclosure.

For example, the plurality of gate lines 71 extends along the first direction D1, and the plurality of data lines 61 extends along the second direction D2. In the embodiments, the extension direction of the optical filter 12 is aligned with the extension direction of the gate lines 71, and the extension direction of the optical receiver 13 is aligned with the extension direction of the data lines 61, and however, this is not limited in the embodiments of the present disclosure. The extension direction of the optical filter 12 can be correspondingly adjusted in accordance with the direction of the first bending axis B1 of the flexible substrate 200.

For example, as shown in FIG. 5B, the optical filter 12 overlap a gate line 71 in a direction perpendicular to the base substrate 100. For example, the optical receiver 13 overlaps a data line 61 in a direction perpendicular to the base substrate 100. The arrangement can minimize the light-emitting area occupied by the optical filter 12 and the optical receiver 13, thereby facilitating increasing the aperture ratio of the flexible substrate 200. For example, the orthographic projection of the optical filter 12 on the base substrate 100 falls within the orthographic projection of the gate line 71 on the base substrate 100; and the orthographic projection of the optical receiver 13 on the base substrate 100 falls within the orthographic projection of the data line 61 on the base substrate 100.

FIG. 5C shows a schematic cross-sectional view of the pixel units 20 along a section line B-B'. For clarity, only the second light-emitting element (OLED) 320 in the pixel unit 20 and the second transistor 330 connected directly to the second light-emitting element 320 are shown. For example, the second transistor 330 can be a driving transistor configured to operate in a saturated state and control the magnitude of the electrical current that drives the second light-emitting element 320 to emit light. For example, the first transistor 330 may also be a light emission control transistor for controlling whether the electrical current that drives the second light-emitting element 320 to emit light flows or not.

The type, material, and structure of the second transistor 330 are not limited in the embodiments of the present disclosure. For example, the second transistor can be a top-gate type, a bottom-type, or the like; the active layer of the second transistor can be amorphous silicon, polysilicon (low-temperature polysilicon and high-temperature polysilicon), oxide conductors, or the like; and the second transistor can be N-type or P-type.

As shown in FIG. 5C, the second transistor 330 comprises a gate electrode 331, a gate insulation layer 332, an active layer 333, a source electrode 334 and a drain electrode 335. The second light-emitting element 320 comprises a first electrode 321, a light-emitting layer 322, and a second electrode 323. For example, in at least an example, the second light-emitting element 320 can further comprise at least one of a hole injection layer, a hole transport layer, an electron injection layer, an electron transport layer, etc., in additional to the light-emitting layer 322. The first electrode 321 of the second light-emitting element 320 is in electrical communication with the drain electrode 335 of the second transistor 330.

It should be noted that the second transistor 330 can be symmetric in its physical structure, and thus the source electrode 334 and the drain electrode 335 of the second transistor 330 is structurally interchangeable.

As shown, the flexible substrate 200 further comprises a planarization layer 301, and the second light-emitting element 320 is disposed on the planarization layer 301 and in electrical communication with the second light-emitting element 320 via a through-hole in the planarization layer 301.

As shown, the flexible substrate 200 further comprises an interlayer insulation layer 302 for insulation disposed between the gate electrode 331 of the second transistor 330 and the source-drain electrode layer. The source electrode 334 and the drain electrode 335 of the second transistor 330 are in contact with the active layer 333 via the through-holes in the interlayer insulation layer 302.

As shown, the flexible substrate 200 further comprises a second pixel defining layer 303 disposed on the first electrode 321 of the second light-emitting element 320 for isolating the light-emitting layers of the light-emitting elements of adjacent sub-pixels to prevent crosstalk. An opening is formed in the second pixel defining layer 303 at a position corresponding to the first electrode 321 to at least partly expose the first electrode 321, and the light-emitting layer 322 is formed in the opening. The second electrode 322 is formed on the light-emitting layer 322 and the second pixel defining layer 303. For example, the second pixel defining layer 303 can be an organic material, e.g., a resin or the like, or an inorganic material, e.g., silicon oxide.

For example, when the first light-emitting element 11 and the optical filter 12 is used in an OLED array substrate, the first light-emitting element 11 and the optical filter 12 can be formed by use of the layered structure originally provided in the OLED array substrate.

For example, with reference to FIG. 5B and FIG. 5C in combination, the planarization layer 301, the second pixel defining layer 303 and the interlayer insulation layer 302 can serve as the first film layer 121, the second film layer 122 and the third film layer 123 of the optical filter 12, respectively, thereby saving processes for formation. In that case, the refractive index of the planarization layer is, e.g., higher than the refractive indexes of the second pixel defining layer 303 and the layered insulation layer 302.

For example, the first light-emitting element 11 and the second light-emitting element 320 have a similar structure, and the respective layer structures are disposed in the same layers and formed in the same patterning processes.

For example, the driving circuit of the first light-emitting element 11 and the pixel circuit of the pixel unit 20 have similar structures, and the respective layer structures are disposed in the same layers and formed in the same patterning processes. For example, the first transistor 310 and the second transistor 330 have similar structures, and the respective layer structures are disposed in the same layers and formed in the same patterning processes.

For example, the position of the optical filter 12 is adaptively adjusted in accordance with the different material conditions used for the flexible substrate 200. Detailed description can be referred to FIG. 3 and FIG. 4, and are not reiterated here.

For example, the first light-emitting element 11 is disposed on the edge portion of the base substrate 100, e.g., disposed along the inner or outer edges of the display area. For example, all the pixel units 20 are located at the same side of the first light-emitting element 11. This arrangement allows the optical filter 12 to be continuously distributed in the first direction D1 so as to cover the whole flexible substrate 200 in the extension of the first direction D1. As a result, when the flexible substrate 200 is bent along the first bending axis B1, whether the first bending axis B1 moves to any position in the first direction D1, the bending degree of the flexible substrate 200 at the position can be measured by use of the optical filter 12.

For example, the optical filter 12 can be disposed at a position where the flexible substrate 200 is to be bent as desired in practice. The period direction L of the grating 130 is set to be orthogonal to the extension direction the first bending axis B1 of the flexible substrate 200.

In some other examples, the second light-emitting element 320 is reused as the first light-emitting element 11; alternatively the first light-emitting element 11 is further used to perform the display operation. For example, the second light-emitting element 320 of the pixel unit 20 in the flexible substrate 200 which is closest to the edge of the base substrate edge is reused as the first light-emitting element 11.

It can be seen that, in the embodiments of the present disclosure, the first light-emitting element and the optical filter can be formed together with the original structure in the flexible substrate or reused from the original structure, so no additional components are required, which not only saves process and cost, but also effectively improves the integration and aesthetics of the flexible substrate.

Figure 6:
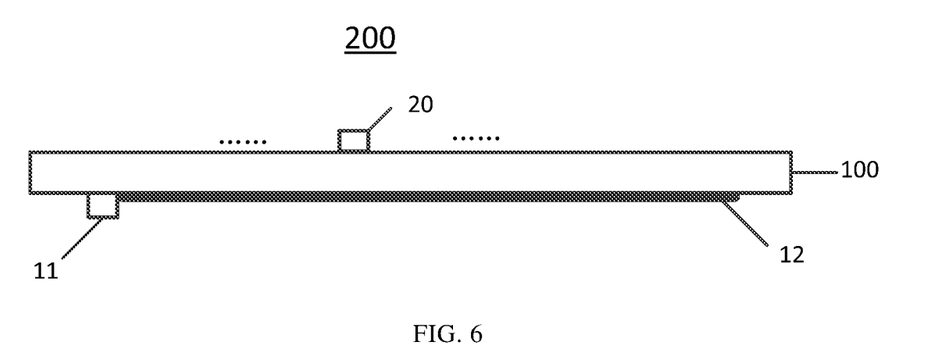
FIG. 6 is a schematic view of a flexible substrate provided in some other embodiments of the present disclosure.

FIG. 6 is a schematic view of a flexible substrate provided in some other embodiments of the present disclosure. As shown, the first light-emitting element 11 and the optical filter 12 are disposed on the different side of the base substrate 100 from the pixel units 20. In that case, the first light-emitting element 11 and the optical filter 12 are formed on the back surfaces of the base substrate 100, respectively.

For example, the flexible substrate 200 further comprises a sealing layer 12 (not shown) covering the first light-emitting element 11 and the optical filter. The sealing layer is configured to seal the first light-emitting element 11 to prevent external moisture and oxygen from penetrating the light-emitting element and causing damage to the devices. For example, the sealing layer comprises an organic film or comprises an alternately-laminated structure of organic films and inorganic films.

For example, the flexible substrate 200 can comprise a plurality of optical filters 12.

For example, a plurality of optical filters 12 may be provided corresponding to one bending axis direction. This arrangement can improve the measurement accuracy of the bending degree when the flexible substrate is bent along the bending axis.

For example, the optical filters 12 can be respectively provided corresponding to a plurality of bending axis directions to measure the bending degree of the flexible substrate when the flexible substrate is bent along the bending axes along the different directions.

Figure 7:
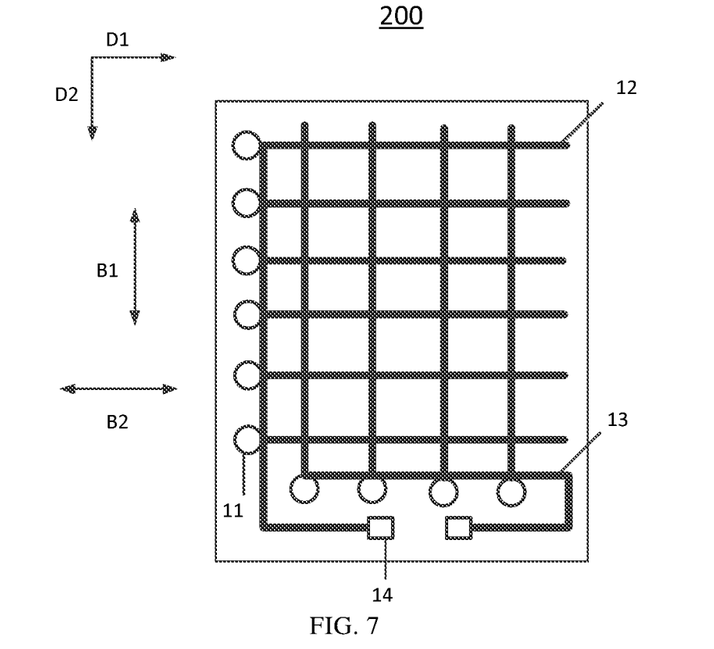
FIG. 7 is a schematic planar view of a flexible substrate provided in yet some other embodiments of the present disclosure.

FIG. 7 shows a schematic planar structural view provided in another embodiment of the present disclosure. As shown, the flexible substrate 200 comprises a plurality of optical filters 12 extending along the first direction D1 and a plurality of optical filters 12 extending along the second direction D2; each optical filter 12 comprises a first light-emitting element 11 correspondingly. For convenience of description, the optical filters extending along the first direction D1 and the optical filters extending along the second direction D2 are defined as the first optical filters and the second optical filters, respectively.

For example, the flexible substrate is a display substrate which further comprises a plurality of gate lines extending along the first direction D1 and a plurality of data lines extending along the second direction D2. For example, the first optical filters 12 overlap the gate lines in a direction perpendicular to the base substrate 100. For example, the second optical filters 12 overlap the data lines in a direction perpendicular to the base substrate 100. The arrangement can minimize the light-emitting area occupied by the optical filters 12, thereby facilitating increasing the aperture ratio of the flexible substrate 200.

For example, the first optical filters are connected to a photoelectric converter 14 (defined as the first photoelectric converter) via an optical receiver(s) 13 (defined as the first optical receiver); and the second optical filters are connected to a photoelectric converter 14 (defined as second photoelectric converter) via an optical receiver(s) 13 (defined as second optical receiver).

For example, the plurality of first optical filters are connected by the optical receiver 13 via the same first optical receiver, and the plurality of second optical filters are connected via the same second optical receiver 13.

For example, the flexible substrate 200 further comprises a processing circuit (not shown) in connection with the first photoelectric converter and the second photoelectric converter. The processing circuit receives and processes electric signals converted by the photoelectric converter(s) to calculate the bending degree of the flexible substrate. For example, the processing circuit can be implemented by means of Central Processing Unit (CPU), Field Programmable Gate Array (FPGA), Digital Signal Processer (DSP) or other processing units having data-processing capability and/or command-executing capacity and the corresponding computer commands. The processing unit can be a generalized processer or a dedicated processer, which can be an X86- or ARM-based processer or the like.

For example, the flexible substrate 200 has a first bending axis B1 parallel to second direction D2 and a second bending axis B2 parallel to the first direction D1, namely, the flexible substrate can be bent along the first bending axis B1 and also can be bent along the second bending axis B2. For example, the first optical filter is configured to measure the bending degree of the flexible substrate bent along the first bending axis B1, and the second optical filter is configured to measure the bending degree of the flexible substrate bent along the second bending axis B2. The particular measurement methods and measurement principles are described above, and the details are not reiterated here.

Figure 8:
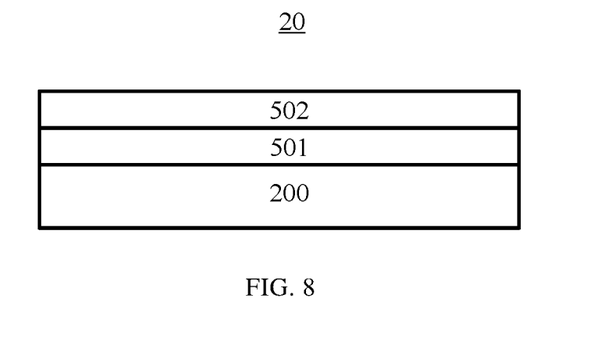
FIG. 8 is a schematic view of a display panel provided in some embodiments of the present disclosure.

As shown in FIG. 8, some embodiments of the present disclosure further provides a display panel 20 comprising the flexible substrate 200 as described above. For example, the display panel can be an OLED display panel which comprises correspondingly the flexible substrate which is an OLED substrate. For example, the display panel further comprises a sealing layer 501 and a covering substrate 502 disposed on the array substrate 200; the sealing layer 501 is configured to seal the light-emitting element (the first light-emitting element 11 and the second light-emitting element 320) to prevent external moisture and oxygen from penetrating to the light-emitting element and the driving circuit and cause damage to the devices. For example, the sealing layer 501 comprises an organic film or comprises an alternately-laminated structure of organic films and inorganic films. For example, a moisture adsorption layer (not shown) can be further disposed between the sealing layer 501 and the array substrate 200, and configured to absorb the moisture or sol remaining in the light-emitting element 300 during previous manufacturing processes. Examples of the covering substrate 502 can include a glass covering substrate. For example, the covering substrate 502 and sealing layer 501 can be in an integrated structure.

At least one embodiment of the present disclosure also provides a display device comprising the flexible substrate or the display panel as described above. The display device can be, for example, products or components having any display function, such as, digital photo frame, smart bracelet, smart watch, mobile phone, tablet computer, display, notebook computer, navigator, and the like.

Some embodiments of the present disclosure further provides a method of preparing a flexible substrate, the method comprising at least: providing a base substrate, forming a first light-emitting element and an optical filter on the base substrate; the optical filter is configured to receive a first light beam emitted by the first light-emitting element and filter the first light beam to obtain a second light beam, and configured to enable the physical properties of the second light beam to be modulated by a bending degree of the optical filter at a position where the flexible substrate is located.

Hereinafter, the method of preparing the flexible substrate provided in an embodiment of the present disclosure is exemplarily illustrated by taking the flexible substrate 200 shown in FIG. 1B with reference to FIG. 1B.

As shown in FIG. 1B, a pixel driving circuit of the first light-emitting element 11 is formed on the base substrate 100, and configured to drive the first light-emitting element 11 to emit light. For example, the forming of the pixel driving circuit comprises forming a first transistor 310, e.g., comprising forming sequentially an active layer 313, a gate insulation layer 312, a gate electrode 311, a second insulation layer 202, and a source-drain electrode layer (including a source electrode 314 and a drain electrode 315) on the base substrate 100. For example, a part of the second insulation layer 202 operates as the third film layer 123 of the optical filter.

For example, the base substrate 100 can be made from a flexible material with good heat resistance and durability, such as, polyimide (PI), polycarbonate (PC), polyethylene vinylterephthalate (PET), polyethylele, poly acrylate, poly arylate, polyetherimide, polyethersulfone, polyvinyltereph-thalate (PET), polyethylene (PE), polypropylene (PP), poly-sulfone (PSF), polymethyl methacrylate (PMMA), cellulose triacetate (TAC), cyclic olefin polymer (COP), cyclic olefin copolymer (COC), or the like.

A first insulation layer 201 is formed on the source-drain electrode layer, e.g., a part of the first insulation layer 201 operates as the first film layer 121 of the optical filter. Then, the first insulation layer 201 is subject to patterning to form a through-hole for connecting the drain electrode and a first surface 110 with a recessed structure therein, and allow a portion of the first insulation layer 201 for use as the first film layer 121 of the optical filter to form a plurality of grating ridges 120 periodically that are arranged in the first direction D1.

For example, the first insulation layer 201 is etched by using a dry etching process to form the recessed structure and the grating structure. The dry etching process has better anisotropy, and can form a predetermined morphology on the first insulation layer 201 by an etching rate of an etching gas. A first electrode 111, a light-emitting layer 112, a first pixel defining layer 203, and a second electrode 113 are sequentially formed on the first insulation layer 201 to form a first light-emitting element 11. For example, a planarization process is used to allow the first electrode 111 to form a flat surface after filling of the recessed structure in the first insulation layer 201. The light-emitting layer 112 is correspondingly formed on the flat surface of the first electrode 111, which is beneficial to improve the light-emitting properties of the light-emitting layer 112. The first electrode 111 is connected to the drain electrode 315 of the first transistor 310 via the through-hole in the first insulation layer 201. The first electrode 111 is formed on, for example, the first surface 110 in the first insulation layer 201. A part of the first pixel defining layer 203 operates as a second film layer 122 of the optical filter.

For example, the refractive index of the first film layer 121 is higher than those of the second film layer 122 and the third film layer 123 to form a first optical waveguide 131. The extending direction of the first optical waveguide 121 is aligned with the periodical arrangement direction of the grating ridges 120, that is, the first direction D1. For example, the first film layer 121 is the core layer of the first optical waveguide, and the second film layer 122 and the third film layer 123 are the upper cladding layer and the lower cladding layer of the first optical waveguide, respectively. For example, the first optical waveguide 131 is coupled to the grating 130 to form a waveguide grating structure. For example, the waveguide grating structure is a planar waveguide grating structure. The first optical waveguide facilitates to reduce attenuation of light during the transmission of in the first film layer.

As shown in FIG. 1B, the second film layer 122 is further filled into the gaps between the grating ridges 120, that is to say, the grating ridges 120 are surrounded by materials with a low refractive index (the second film layer 122 and the third film layer 123).

For example, the first film layer 121 comprises a transparent material.

For example, the first film layer 121 and the second film layer 122 are both organic materials, and the material of the third film layer 123 is an inorganic material.

For example, the first light-emitting element 11 is an organic light-emitting diode (OLED). For example, in at least some examples, the light-emitting element 11 can include at least one of a hole injection layer, a hole transport layer, an electron injection layer, an electron transport layer, and the like, in addition to the light-emitting layer 112.

For example, the first light-emitting element 11 is a bottom emission structure, the first electrode 111 is transmissive, and the second electrode 113 is reflective. For example, the first electrode 111 is a high-work-function transparent conductive material, such as, indium tin oxide (ITO), etc.; the second electrode 113 is, e.g., a metal or a metal alloy material, such as, an Ag/Mg alloy material.

For example, the position of the optical filter 12 can be adaptively adjusted according to different material conditions in the flexible substrate 200, which is not limited in the embodiments of the present disclosure.

For example, as shown in FIG. 3, an electrode material with a low refractive index can also be used as the second film layer 122 of the optical filter 12. For example, the second film layer 122 of the optical filter 12 is formed together with the first electrode 11 of the first light-emitting element 11, or the second film layer 122 and the first electrode 111 form an integrated structure.

For example, as shown in FIG. 4, when the refractive index of the material of the first insulation layer 201 is low and not suitable for the material of the first film layer 121, a third insulation layer 204 with a high refractive index can be additionally formed on the first insulation layer 201 as the first film layer 121. For example, an electrode material layer with a low refractive index can be additionally formed between the third insulation layer 204 and the first insulation layer 201 to serve as the third film layer 123. For example, the material of the first insulation layer 201 can be an organic insulating material, such as, a resin. For example, the material of the third insulation layer is an inorganic insulating material, such as, an oxide or nitride of silicon. For example, the material of the electrode material layer is a transparent conductive oxide material, such as, indium tin oxide (ITO).

For example, when the flexible substrate is an OLED display substrate, the first light-emitting element 11 and the optical filter 12 may be formed on a display side or a non-display side (back surface) of the flexible substrate. For example, when the first light-emitting element 11 and the optical filter 12 are formed on the display side of the flexible substrate, that is, they are formed on the same side of the base substrate 100 as the display pixels of the flexible substrate, the first light-emitting element 11 and the optical filter 12 can be manufactured together with the OLED of the flexible substrate, and the driving circuit can be manufactured together with the pixel circuit of the pixel unit without additional processes. The description is not reiterated here.

In the above preparation method, for example, a conventional physical vapor deposition such as, a sputtering process (e.g., forming a conductive layer), a chemical vapor deposition process (e.g., forming an insulation layer), a spin coating process (e.g., forming an organic layer), a photolithography process (e.g., patterning) can be used.

Some embodiments of the present disclosure further provide a method of measuring the bending degree of the flexible substrate as described, comprising: the first light-emitting element emits a first light beam, the optical filter receives and filters the first light beam to obtain a second light beam; and the bending degree of the flexible substrate at a position where the optical filter is located is measured according to the physical properties of the second light beam.

The measurement method refers particularly to the foregoing description for details, e.g., FIG. 2A and FIG. 2B, and is not reiterated here.

The foregoing is merely an exemplary implementation of the present disclosure, and is not intended to limit the scope of protection of the present disclosure. The scope of protection of the present disclosure is defined by the accompanying claims.

What is claimed is:
1. A flexible substrate comprising:
a base substrate;
a first light-emitting element and an optical filter disposed on the base substrate,
wherein the optical filter is configured to receive a first light beam emitted by the first light-emitting element and filter the first light beam to obtain a second light beam, and configured to enable physical properties of the second light beam to be modulated by a bending degree of the flexible substrate at a position where the optical filter is located;
an optical receiver,
wherein the optical receiver is configured to receive the second light beam from the optical filter and transmit the second light beam along a first path; and
a photoelectric converter,
wherein the photoelectric converter is disposed at a distal end of the optical receiver away from the optical filter, and
the photoelectric converter is in connection with the optical receiver to receive the second light beam and converts the second light beam to an electric signal.

2. The flexible substrate according to claim 1, wherein the optical filter comprises a first film layer which is configured to receive the first light;
the first film layer comprises a plurality of grating ridges that are periodically arranged to form a grating configured to filter the first light beam incident on the first film layer to obtain the second light beam.

3. The flexible substrate according to claim 2, wherein the optical filter further comprises a second film layer and a third film layer,
the third film layer, the first film layer, and the second film layer are sequentially disposed on the base substrate, and a refractive index of the first film layer is higher than refractive indexes of the second film layer and the third film layer to form a first optical waveguide; and
an extension direction of the first optical waveguide is aligned with a periodical arrangement direction of the grating ridges.

4. The flexible substrate according to claim 3, wherein the first light-emitting element comprises a first electrode, a light-emitting layer, and a second electrode, and the first electrode and the second film layer of the optical filter are disposed in a same layer or formed in an integrated structure.

5. The flexible substrate according to claim 3, wherein the flexible substrate further comprises a first insulation layer disposed on the base substrate, the first light-emitting element is disposed on the first insulation layer, and
a part of the first insulation layer operates as the first film layer or the third film layer of the optical filter.

6. The flexible substrate according to claim 3, wherein the first film layer comprises a first surface at an incident side of the first light, and the first surface is configured to direct the first light beam into the first optical waveguide.

7. The flexible substrate according to claim 6, wherein the extension direction of the first optical waveguide is parallel to the base substrate, and an angle between the first surface and the base substrate is an acute angle.

8. The flexible substrate according to claim 6, wherein the first electrode is disposed on the first surface of the first film layer.

9. The flexible substrate according to claim 1, wherein the flexible substrate further comprises a gate line extending along a first direction and a data line along a second direction,
the optical filter extends along the first direction and overlaps the gate line in a direction perpendicular to the base substrate; or the optical filter extends along the second direction and overlaps the data line in a direction perpendicular to the base substrate.

10. The flexible substrate according to claim 1, wherein the optical receiver comprises a second optical waveguide,
the second optical waveguide is in connection with the first optical waveguide to receive the second light beam, and the second optical waveguide extends along the first path.

11. The flexible substrate according to claim 1, wherein the optical receiver and the first light-emitting element are disposed at a same side or opposite sides of the optical filter.

12. The flexible substrate according to claim 1, wherein the flexible substrate further comprises a pixel unit disposed on the base substrate to perform a display operation, and
the pixel unit comprises a second light-emitting element to perform a display operation.

13. The flexible substrate according to claim 12, wherein the optical filter, the first light-emitting element, and the pixel unit are disposed at a same side of the base substrate.

14. The flexible substrate according to claim 12, wherein the first light-emitting element is further configured to perform the display operation.

15. The flexible substrate according to claim 12, wherein the optical filter and the first light-emitting element are disposed at a different side of the base substrate from the pixel unit.

16. A display panel comprising a flexible substrate, wherein the flexible substrate comprises:
a base substrate;
a first light-emitting element and an optical filter disposed on the base substrate,
wherein the optical filter is configured to receive a first light beam emitted by the first light-emitting element and filter the first light beam to obtain a second light beam, and configured to enable physical properties of the second light beam to be modulated by a bending degree of the flexible substrate at a position where the optical filter is located;

an optical receiver,
wherein the optical receiver is configured to receive the second light beam from the optical filter and transmit the second light beam along a first path; and
a photoelectric converter,
wherein the photoelectric converter is disposed at a distal end of the optical receiver away from the optical filter, and
the photoelectric converter is in connection with the optical receiver to receive the second light beam and converts the second light beam to an electric signal.

17. A method of preparing a flexible substrate, the comprising:
providing a base substrate, and
forming a first light-emitting element and an optical filter on the base substrate,
wherein the optical filter is configured to receive a first light beam emitted by the first light-emitting element and filter the first light beam to obtain a second light beam, and configured to enable physical properties of the second light beam to be modulated by a bending degree of the flexible substrate at a position where the optical filter is located;
providing an optical receiver at a same side or opposite sides of the optical filter to receive the second light beam from the optical filter and transmit the second light beam along a first path; and
providing a photoelectric converter at a distal end of the optical receiver away from the optical filter, and
the photoelectric converter is in connection with the optical receiver to receive the second light beam and converts the second light beam to an electric signal.

18. The method according to claim 17, wherein the forming the optical filter comprising:
forming a third film layer on the base substrate;
forming a first film layer on the third film layer to form a gating, wherein the first film layer comprises a plurality of grating ridges that are periodically arranged;
forming a second film layer on the first film layer, wherein a refractive index of the first film layer is higher than refractive indexes of the second film layer and the third film layer to form a first optical waveguide; and
an extension direction of the first optical waveguide is aligned with a periodical arrangement direction of the grating ridges.

* * * * *